(12) United States Patent
Cai et al.

(10) Patent No.: US 11,894,334 B2
(45) Date of Patent: Feb. 6, 2024

(54) DUAL HEAD CAPILLARY DESIGN FOR VERTICAL WIRE BOND

(71) Applicant: Intel Corporation, Santa Clara, CA (US)

(72) Inventors: Yuhong Cai, Folsom, CA (US); Bilal Khalaf, Folsom, CA (US); Yi Xu, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 1034 days.

(21) Appl. No.: 16/160,212

(22) Filed: Oct. 15, 2018

(65) Prior Publication Data

US 2020/0118961 A1    Apr. 16, 2020

(51) Int. Cl.
*H01L 23/00* (2006.01)
*H01L 25/065* (2023.01)

(52) U.S. Cl.
CPC .............. *H01L 24/48* (2013.01); *H01L 24/78* (2013.01); *H01L 25/0657* (2013.01); *H01L 2224/48011* (2013.01); *H01L 2224/48145* (2013.01); *H01L 2224/48227* (2013.01); *H01L 2225/0651* (2013.01); *H01L 2225/06506* (2013.01); *H01L 2225/06562* (2013.01)

(58) Field of Classification Search
CPC .................. H01L 25/0657; H01L 2225/06506
See application file for complete search history.

(56) References Cited

U.S. PATENT DOCUMENTS

2008/0023831 A1* 1/2008 Nishimura .............. H01L 24/48
257/737

* cited by examiner

*Primary Examiner* — Yu-Hsi D Sun
(74) *Attorney, Agent, or Firm* — Schwabe, Williamson & Wyatt, P.C.

(57) ABSTRACT

Embodiments disclosed herein include wire bonds and tools for forming wire bonds. In an embodiment, a wire bond may comprise a first attachment ball, and a first wire having a first portion contacting the first attachment ball and a second portion. In an embodiment, the wire bond may further comprise a second attachment ball, and a second wire having a first portion contacting the second attachment ball and a second portion. In an embodiment, the second portion of the first wire is connected to the second portion of the second wire.

10 Claims, 5 Drawing Sheets

US 11,894,334 B2

DUAL HEAD CAPILLARY DESIGN FOR VERTICAL WIRE BOND

TECHNICAL FIELD

Embodiments of the present disclosure relate to electronic packaging, and more particularly, to a vertical wire bonds for making face-to-face wire bond connections between substrates of an electronic package.

BACKGROUND

Wire bonds are currently used to provide interconnects between components in electronic packages. Wire bonds typically couple conductive pads on a first substrate to conductive pads on a second substrate. The conductive pads that are coupled together by a wire bond are oriented so that they face the same direction. That is, a conductive pad on the first substrate may face away from the conductive pad on the second substrate. Accordingly, a large wire loop is needed in order to make the connection between the two pads. Such a configuration requires large pad sizes and the wire loops are hard to control, which may lead to shorting between wires.

An additional interconnect architecture is the use of flip chip technology. In a flip chip interconnect, the conductive pads on opposing substrates are oriented so that they face each other. The conductive pads are then connected to each other by a solder bump. Such interconnect architectures require large pitches to accommodate the solder balls. Additionally, copper pillar heights are limited (e.g., between 50 microns and 100 microns). Flip chip interconnects are also relatively high cost interconnects due to the need for redistribution layers (RDLs) in many instances.

EMBODIMENTS OF THE PRESENT DISCLOSURE

Described herein are electronic packages with vertical wire bonds for making face-to-face wire bond connections between substrates of an electronic package. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current interconnect architectures do not allow for low-cost fine-pitch face-to-face interconnects. Particularly, current wire bond interconnects require the conductive pads to be facing in the same direction (i.e., not face-to-face), and flip chip interconnects are expensive and not suitable for fine pitch applications. Accordingly, embodiments disclosed herein include wire bond interconnects that are compatible with conductive pads that are in a face-to-face orientation. Embodiments include a wire bonding tool that is configured to provide the face-to-face wire bond interconnects. Particularly, the wire bonding tool includes a dual head design that allows for two wires to be fed into the tool. A first wire is directed in a first direction and the second wire is fed in a second direction. In an embodiment, the dual heads can be articulated in order to bring portions of the first wire and the second wire together to form an electrical connection between the two wires.

Figure 1A:
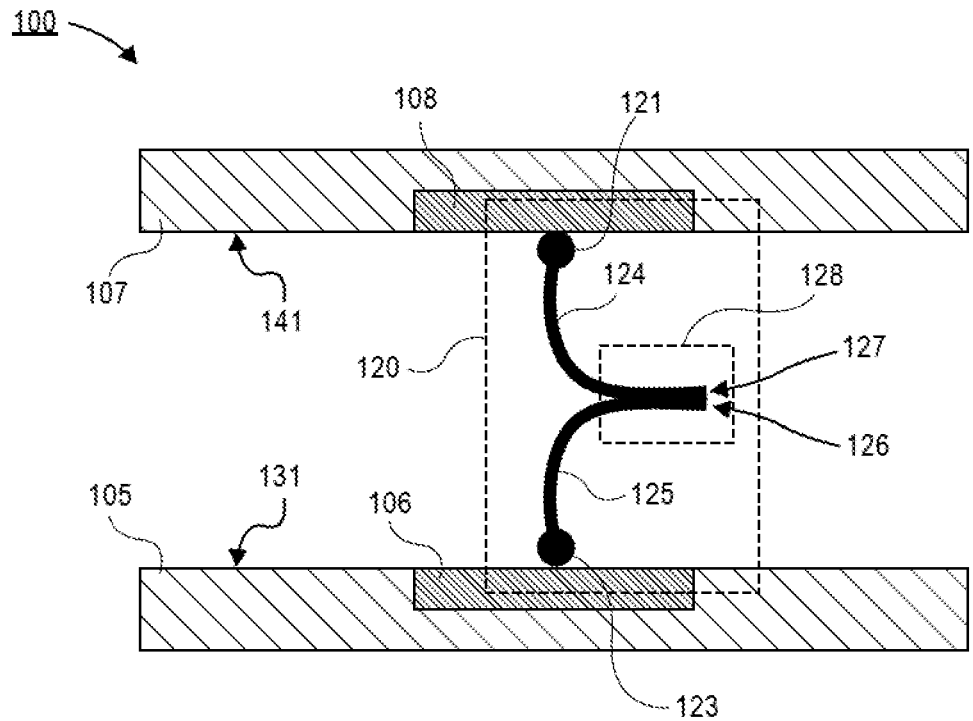
FIG. 1A is a cross-sectional illustration of a vertical wire bond that electrically couples pads on opposing substrates in a face-to-face configuration, in accordance with an embodiment.

Referring now to FIG. 1A, a cross-sectional illustration of a portion of an electronic package 100 is shown, in accordance with an embodiment. In an embodiment, the electronic package 100 may include a first substrate 105 and a second substrate 107. In an embodiment, the first substrate 105 and the second substrate 107 may be any substrates that are typically included in electronic packages 100. For example, the first substrate 105 and the second substrate 107 may be a package substrate or a semiconductor die. In an embodiment, the first substrate 105 may include a first conductive pad 106, and the second substrate 107 may include a second conductive pad 108. The first conductive pad 106 may be on a first surface 131 of the first substrate 105, and the second conductive pad 108 may be on a first surface 141 of the second substrate 107. In an embodiment, the first surface 131 of the first substrate 105 may be oriented so that the first surface 131 is facing the first surface 141 of the second substrate 107. That is, the first surface 131 of the first substrate 105 may be in a face-to-face orientation with respect to the first surface 141 of the second substrate 107.

In an embodiment, the first conductive pad 106 may be electrically coupled to the second conductive pad 108 by a wire bond 120. In an embodiment, the wire bond 120 may comprise a first attachment ball 123 on the first conductive pad 106 and a second attachment ball 121 on the second conductive pad 108. A first wire 125 may be attached to the first attachment ball 123, and a second wire 124 may be attached to the second attachment ball 121. In an embodiment, the first wire 125 and the second wire 124 may extend substantially vertically away from the respective attachment ball 121/123 to which they are attached.

In an embodiment, the wire bond 120 may include a connection region 128. The connection region 128 is the location where the first wire 125 is electrically coupled to the second wire 124. In a particular embodiment, a sidewall surface of the first wire 125 may contact a sidewall surface of the second wire 124 in the connection region 128. In an embodiment, the connection region may have a thickness that is substantially equal to the combined thickness of the first wire 125 and the second wire 124. That is, in the connection region 128 the increased thickness is the result of the first wire 125 being attached to the second wire 124.

In an embodiment, the first wire 125 may be attached to the second wire 124 with a solid state diffusion bonding process, a melting process, or any other bonding process. In other embodiments, the first wire 125 may be attached to the second wire 124 with a crimping process or a braiding (i.e., twisting) process in order to provide enhanced reliability. As shown, the connection between the first wire 125 and the second wire 124 may be substantially along sidewall surfaces of the wires 124/125. That is, end surfaces 126 and 127 of the first wire 125 and the second wire 124, respectively, may not be connected together.

In an embodiment, the wire bond 120 may comprise a first attachment ball 123 and a second attachment ball 121 that are substantially aligned with each other. That is, the first attachment ball 123 and the second attachment ball 121 may be aligned in the X-Y directions. In such embodiments, a length of the first wire 125 may be substantially the same as a length of the second wire 124. As used herein, the length of the wires 125/124 may refer to the length of a wire from the attachment ball 123/121 to the end surface 126/127 of the wire.

Figure 1B:
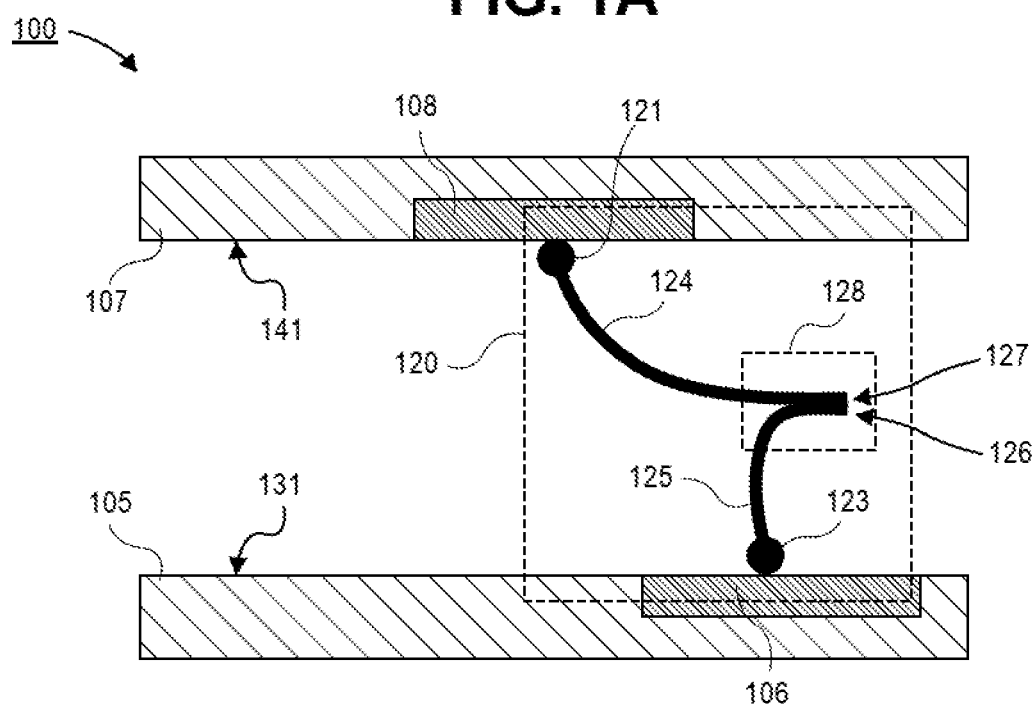
FIG. 1B is a cross-sectional illustration of a vertical wire bond that electrically couples pads on opposing substrates that are not aligned, in accordance with an embodiment.

Referring now to FIG. 1B, a cross-sectional illustration of an electronic package 100 is shown, in accordance with an additional embodiment. In an embodiment, the electronic package 100 may be substantially similar to the electronic package illustrated in FIG. 1A, with the exception that the first attachment ball 123 is not aligned with the second attachment ball 121. That is, the first attachment ball 123 may not be aligned in the X-Y directions with the second attachment ball 121. Such an embodiment is particularly beneficial when contact pads 106 and 108 are not aligned. Even when the pads 106 and 108 are not aligned, a wire bond connecting face-to-face pads may still be made. As such, embodiments disclosed herein may not require a RDL to re-rout contact pads in order to make wire bonds.

In embodiments where the first attachment ball 123 is not aligned with the second attachment ball 121, the lengths of the first wire 125 and the second wire 124 may not be substantially equal to each other. For example, as shown in FIG. 1B, the first wire 125 may have a length that is shorter than a length of the second wire 124.

Figure 2:
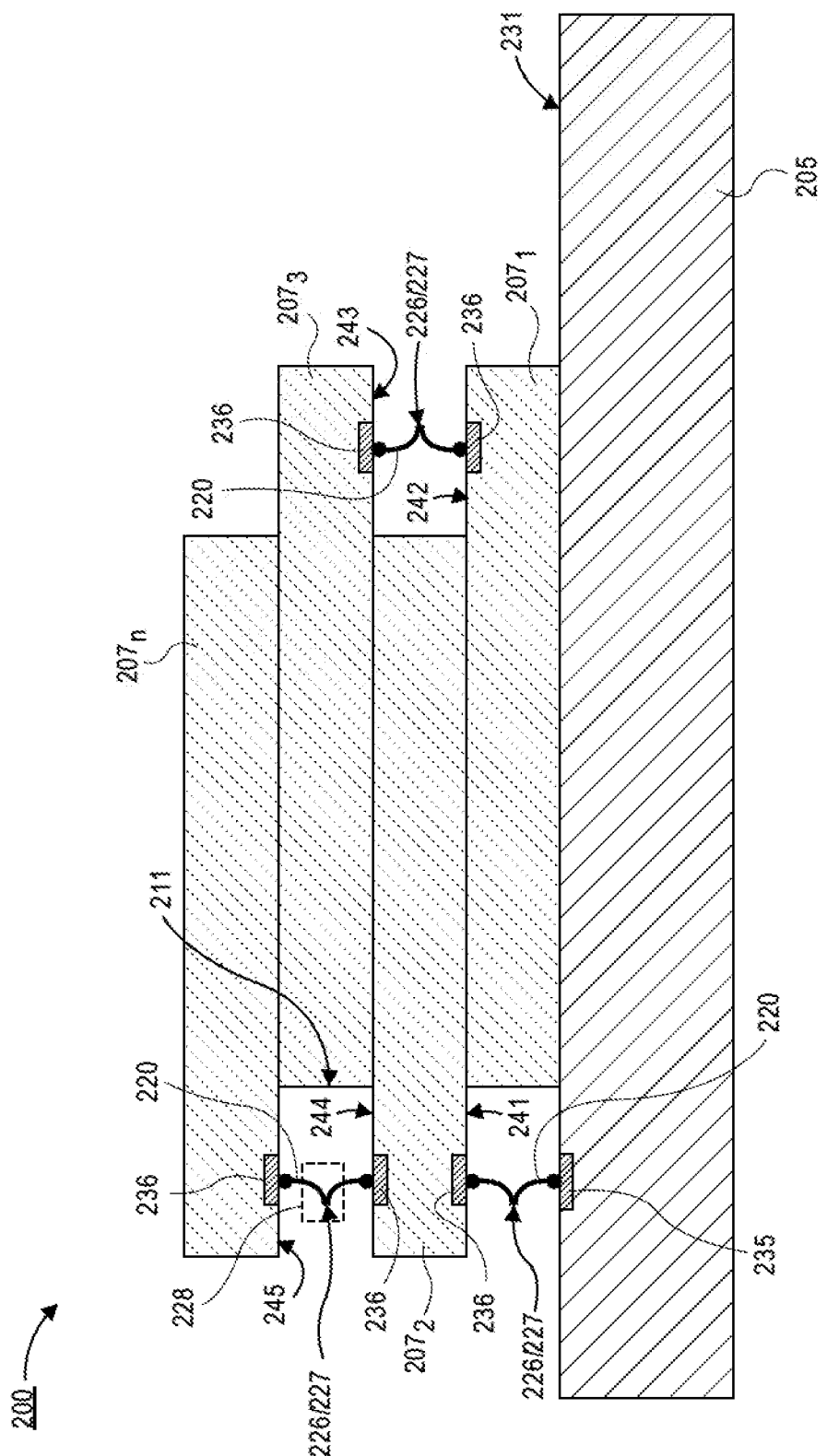
FIG. 2 is a cross-sectional illustration of an electronic package with a plurality of vertical wire bonds connecting substrates in a face-to-face configuration, in accordance with an embodiment.

Referring now to FIG. 2, a cross-sectional illustration of an electronic package 200 is shown, in accordance with an embodiment. In an embodiment, the electronic package 200 may include a package substrate 205 and a die stack with a plurality of dies $207_{1-n}$. In the illustrated embodiment, four dies $207_{1-n}$ are shown, but it is to be appreciated that any number of dies 207 may be positioned over the package substrate 205. In an embodiment, the dies $207_{1-n}$ may be any type of dies. In a particular embodiment, the dies $207_{1-n}$ may be memory dies.

In an embodiment, the dies $207_{1-n}$ may be stacked in an offset pattern. The offset pattern allows for vertical wire bonds 220 to be made between contact pads that are oriented in a face-to-face configuration. For example, a vertical wire bond 220 may be made between conductive pad 235 on a first surface 231 of the package substrate 205 and a conductive pad 236 on a surface 241 of die $207_2$. Similarly, vertical wire bonds 220 may be made between conductive pads 236 on two dies 207. For example, a vertical wire bond 220 is formed between contact pad 236 on surface 245 of die $207n$ and contact pad 236 on surface 244 of die $207_2$, and a vertical wire bond 220 is formed between contact pad 236 on surface 243 of die $207_3$ and contact pad 236 on surface 242 of die $207_1$.

In an embodiment, the connection regions 228 of the wire bonds 220 may be oriented so that they face away from a center of the dies 207 in the die stack. Particularly, end surfaces 226 and 227 of the wires in the wire bond 220 may face away from the sidewalls 211 of the dies 207.

Referring now to FIGS. 3A-3D, a series of schematic illustrations of a wire bonding tool 300 used to form vertical wire bonds such as those described above is shown, in accordance with an embodiment.

Figure 3A:
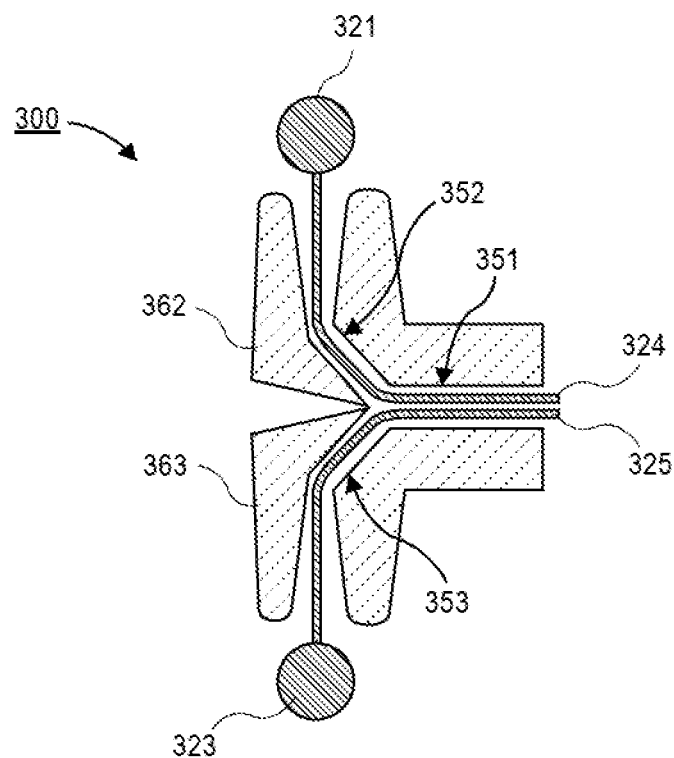
FIG. 3A is a cross-sectional illustration of a dual head capillary wire bonding tool forming attachment balls from wire fed through each head of the tool, in accordance with an embodiment.

Referring now to FIG. 3A, a cross-sectional schematic of a dual head wire bonding tool 300 is shown, in accordance with an embodiment. In an embodiment, the wire bonding tool 300 may include a pathway 351 through which a first wire 325 and a second wire 324 are fed. In an embodiment, the pathway 351 may extend towards a first head 363 and a second head 362. The first head 363 and the second head 362 may contact each other at the end of the pathway 351. In an embodiment, the first wire 325 is fed through the pathway 351 until it reaches the first head 363 which cause the first wire 325 to diverge towards a first exit path 353, and the second wire 324 is fed through the pathway 351 until it reaches the second head 362 which causes the second wire 324 to diverge towards a second exit path 352. In an embodiment, the first exit path 353 may divert the first wire 325 in a first direction and the second exit path 352 may divert the second wire 324 in a second direction. In an embodiment, the first direction may be opposite from the second direction. That is, the first direction may be 180° from the second direction. While the first direction and the second direction are shown as being 180° from each other in FIG. 3A, it is to be appreciated that the first direction and the second direction may have any desired relationship with respect to each other.

As shown in FIG. 3A, after the first wire 325 and the second wire 324 exit the exit paths 353 and 352, respectively, attachment balls 323/321 (i.e., free air balls (FABs)) may be formed (e.g., by a melting process). In an embodiment, the first attachment ball 323 and the second attachment ball 321 may be formed at substantially the same time. Such an embodiment may be used when a wire bond to pads that are aligned in the X-Y directions (similar to FIG. 1A) is made. In embodiments, where the pads are not aligned (similar to FIG. 1B), the first attachment ball 323 and the second attachment ball 321 may be formed at different times.

Figure 3B:
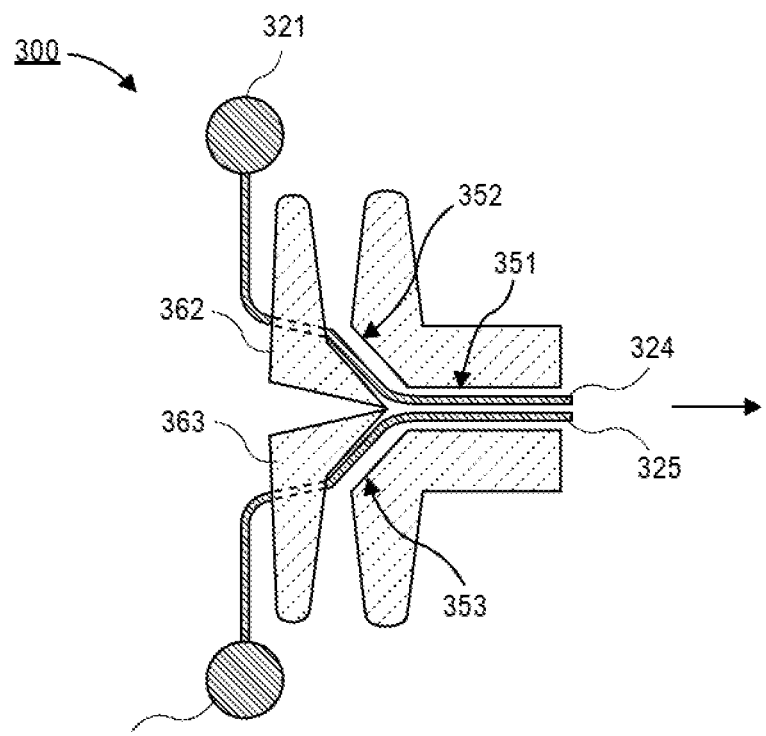
FIG. 3B is a cross-sectional illustration after the wires are fed through a portion of the tool and are brought towards each other, in accordance with an embodiment.

Referring now to FIG. 3B, a cross-sectional illustration after the wires are pulled for loop control is shown, in accordance with an embodiment. As indicated by the arrow, the wire bonding tool 300 is pulled laterally away from the attachment balls 323 and 321. The wires 325 and 324 may pass through channels in the first head 363 and the second head 362, respectively. As shown, the portion of the wires passing through the first head 363 and the second head 362 are shown with dashed lines to indicate that they are passing through the channels below the surfaces of the first head 363 and the second head 362.

Figure 3C:
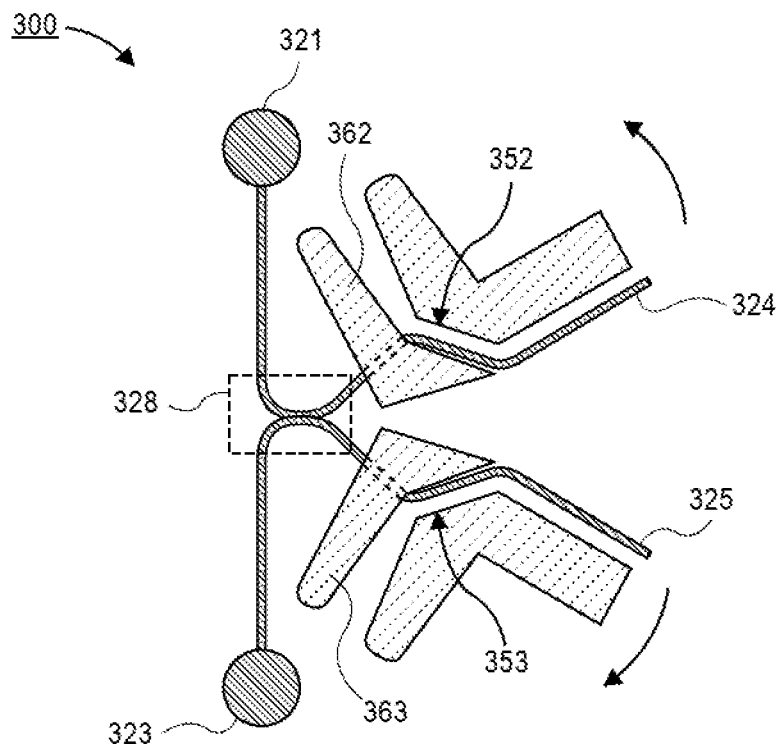
FIG. 3C is a cross-sectional illustration after the wires are bonded together to form an electrical path between the attachment balls, in accordance with an embodiment.

Referring now to FIG. 3C, a cross-sectional illustration after the wire bonding tool 300 is actuated to bring the first wire 325 into contact with the second wire 324 is shown, in accordance with an embodiment. In an embodiment, the wire bonding tool is actuated by opening (as shown by the arrows) the first head 363 with respect to the second head 362 in order to clamp the wires together to form a connection region 328. In an embodiment, first wire 325 and the second wire 324 may have sidewalls that are secured together (e.g., with a melting process or the like).

Figure 3D:
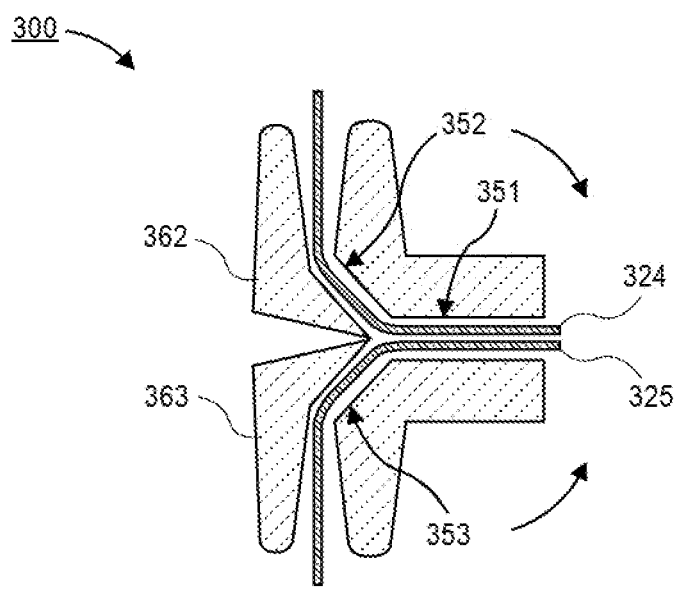
FIG. 3D is a cross-sectional illustration after the wires are cut and the process begins again, in accordance with an embodiment.

Referring now to FIG. 3D, the wire bonding tool 300 is reset to break the first wire 325 and the second wire 324. In an embodiment, the first wire 325 and the second wire 324 may be cut with the bonding tool 300. As shown, the actuating first head 363 and second head 362 are brought back together, as indicated by the arrows. Resetting the bonding tool 300 then allows for the first wire 325 and the second wire 324 to be fed back through the first exit 353 and the second exit 352 in order to repeat the wire bonding process to connect a different pair of contact pads.

Figure 4:
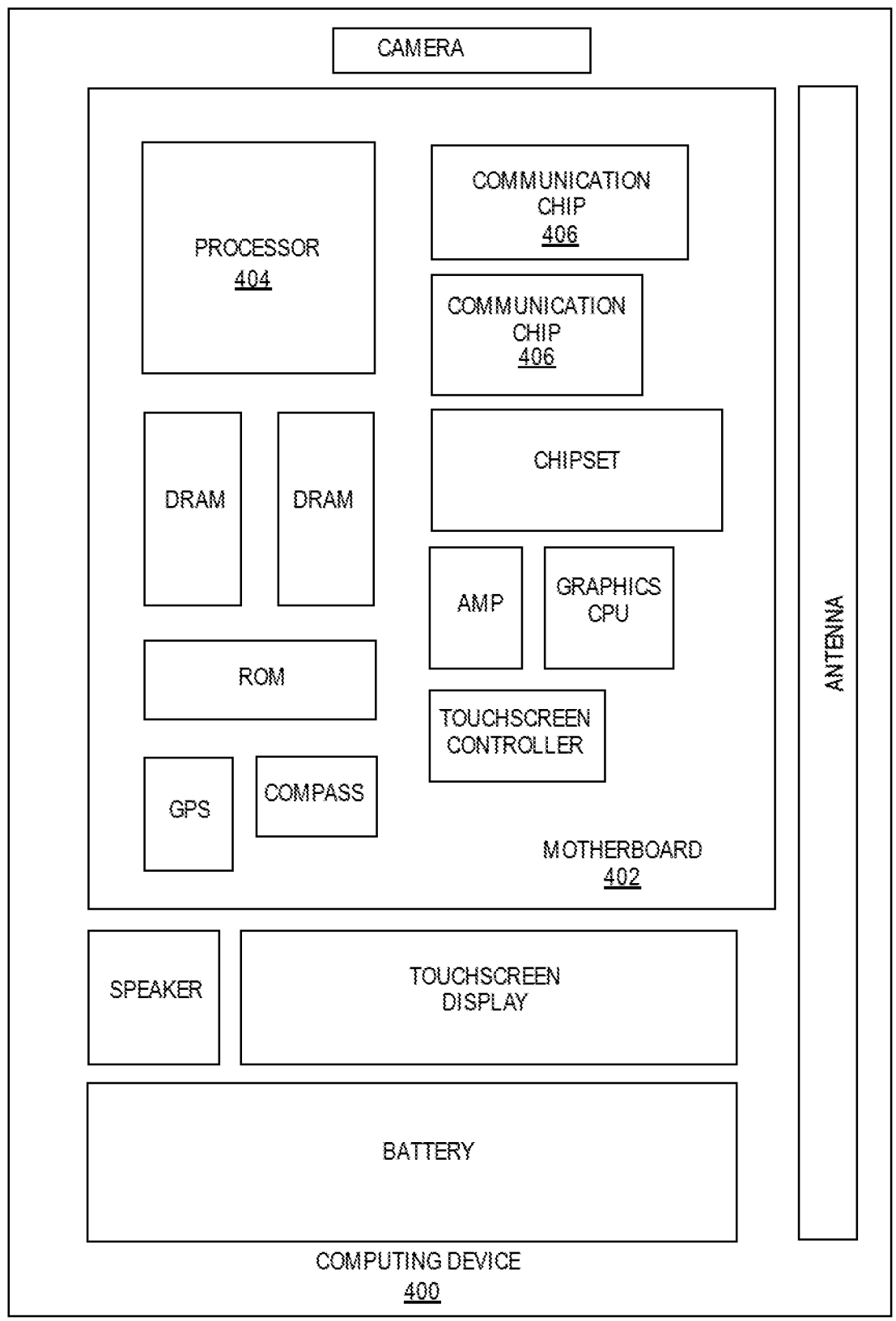
FIG. 4 is a schematic of a computing device built in accordance with an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be packaged in an electronic package that comprises vertical wire bonds connecting contact pads that are in a face-to-face orientation, in accordance with embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be packaged in an electronic package that comprises vertical wire bonds connecting contact pads that are in a face-to-face orientation, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a wire bond, comprising: a first attachment ball; a first wire having a first portion contacting the first attachment ball and a second portion; a second attachment ball; and a second wire having a first portion contacting the second attachment ball and a second portion, wherein the second portion of the first wire is connected to the second portion of the second wire.

Example 2: the wire bond of Example 1, wherein lateral sidewalls of the second portions are bonded together.

Example 3: the wire bond of Example 1 or Example 2, wherein the first wire and the second wire are substantially equal in length.

Example 4: the wire bond of Examples 1-3, wherein the first attachment ball is aligned with the second attachment ball.

Example 5: the wire bond of Examples 1-4, wherein the first attachment ball is not aligned with the second attachment ball.

Example 6: the wire bond of Examples 1-5, wherein the first wire is a different length than the second wire.

Example 7: the wire bond of Examples 1-6, wherein the first attachment ball is coupled to a first substrate.

Example 8: the wire bond of Examples 1-7, wherein the second attachment ball is coupled to a second substrate.

Example 9: the wire bond of Examples 1-8, wherein the first substrate is oriented face-to-face with respect to the second substrate.

Example 10: the wire bond of Examples 1-9, wherein the first substrate is a die and wherein the second substrate is a package substrate.

Example 11: the wire bond of Examples 1-10, wherein the first substrate is a die and wherein the second substrate is a die.

Example 12: an electronic package, comprises: a package substrate having a contact pad on a first surface; a first die on the package substrate having a contact pad on a first surface, wherein the first surface of the package substrate faces the first surface of the first die; and a wire bond electrically coupling the contact pad of the package substrate to the contact pad of the first die.

Example 13: the electronic package of Example 12, wherein the wire bond comprises a first wire portion attached to the contact pad on the package substrate and a second wire portion attached to the contact pad on the first die, wherein the first wire portion is attached to the second wire portion.

Example 14: the electronic package of Example 12 or Example 13, wherein a side surface of the first wire portion is attached to a side surface of the second wire portion.

Example 15: the electronic package of Examples 12-14, wherein end surfaces of the first wire portion and the second wire portion do not contact each other.

Example 16: the electronic package of Examples 12-15, wherein a second die is positioned between the die and the package substrate.

Example 17: the electronic package of Examples 12-16, further comprising a third die over the first die, wherein a second wire bond electrically couples the third die to the second die.

Example 18: the electronic package of Examples 12-17, wherein the second wire bond comprises a first wire portion and a second wire portion.

Example 19: the electronic package of Examples 12-18, wherein end surfaces of the first wire portion and the second wire portion face away from the first die.

Example 20: the electronic package of Examples 12-19, wherein the contact pad of the package substrate is not aligned with the contact pad of the first die.

Example 21: the electronic package of Examples 12-20, wherein the contact pad of the package substrate is aligned with the contact pad of the first die.

Example 22: a tool for wire bonding contact pads together, comprising: a pathway through which a first wire and a second wire are fed; a first exit path coupled to the pathway; a second exit path coupled to the pathway, wherein the first exit path feeds the first wire in a first direction, and wherein the second exit path feeds the second wire in a second direction; a first articulating head that defines a portion of the first exit path; and a second articulating head that defines a portion of the second exit path.

Example 23: the tool of Example 22, wherein the first articulating head and the second articulating head have channels through which wires may pass.

Example 24: the tool of Example 22 or Example 23, wherein the first articulating head and the second articulating head contact each other at a junction between the first exit path and the second exit path.

Example 25: the tool of Examples 22-24, wherein the first articulating head and the second articulating head bring sidewall surfaces of the first wire and the second wire together when articulated.

What is claimed is:

1. A wire bond, comprising:
   a first attachment ball attached to a first surface of a first substrate;
   a first wire having a first portion contacting the first attachment ball and a second portion, the first wire having a sidewall between first and second opposite ends;
   a second attachment ball attached to a first surface of a second substrate, the first surface of the second substrate having a face-to-face orientation with the first surface of the first substrate; and
   a second wire having a first portion contacting the second attachment ball and a second portion, the second wire having a sidewall between first and second opposite ends, wherein the sidewall of the second portion of the first wire vertically overlaps with and is connected to and in direct physical contact with the sidewall of the second portion of the second wire.

2. The wire bond of claim 1, wherein the first wire and the second wire are substantially equal in length.

3. The wire bond of claim 1, wherein the first attachment ball is aligned with the second attachment ball.

4. The wire bond of claim 1, wherein the first attachment ball is not aligned with the second attachment ball.

5. The wire bond of claim 4, wherein the first wire is a different length than the second wire.

6. The wire bond of claim 1, wherein the first attachment ball is coupled to a first substrate.

7. The wire bond of claim 6, wherein the second attachment ball is coupled to a second substrate.

8. The wire bond of claim 7, wherein the first substrate is oriented face-to-face with respect to the second substrate.

9. The wire bond of claim 7, wherein the first substrate is a die and wherein the second substrate is a package substrate.

10. The wire bond of claim 7, wherein the first substrate is a die and wherein the second substrate is a die.

* * * * *